(12) United States Patent
Isogai et al.

(10) Patent No.: US 6,671,037 B2
(45) Date of Patent: Dec. 30, 2003

(54) OPTICAL OBJECT DETECTING APPARATUS DESIGNED TO SELECTIVELY SHIFT LIGHT EMITTING WINDOW

(75) Inventors: Emiko Isogai, Hekinan (JP); Ryoichi Sugawara, Nagoya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/287,714

(22) Filed: Nov. 5, 2002

(65) Prior Publication Data

US 2003/0090647 A1 May 15, 2003

(30) Foreign Application Priority Data

Nov. 9, 2001 (JP) ........................................ 2001-344826

(51) Int. Cl.⁷ ............................. G01C 3/08; G01C 1/00; G01B 11/26; B60T 7/16; B62D 1/24
(52) U.S. Cl. ..................... 356/4.01; 180/169; 356/5.01; 356/141.1
(58) Field of Search .................. 356/141.1, 3.01–5.15; 180/169; 340/435, 436; 701/93, 96, 223, 301

(56) References Cited

U.S. PATENT DOCUMENTS

| | | | | |
|---|---|---|---|---|
| 4,790,651 A | * | 12/1988 | Brown et al. | ............... 356/4.09 |
| 5,552,893 A | * | 9/1996 | Akasu | ........................ 356/5.01 |
| 5,625,447 A | * | 4/1997 | Kikuchi et al. | ............. 356/4.01 |
| 5,805,275 A | * | 9/1998 | Taylor | ........................ 356/3.16 |
| 5,864,391 A | * | 1/1999 | Hosokawa et al. | ........ 356/4.01 |
| 5,870,181 A | * | 2/1999 | Andressen | ................. 356/4.01 |
| 6,301,003 B1 | | 10/2001 | Shirai et al. | |

FOREIGN PATENT DOCUMENTS

| | | |
|---|---|---|
| JP | 6-265349 | 9/1994 |
| JP | 7-198850 | 8/1995 |
| JP | 10-300854 | 11/1998 |
| JP | 11-52045 | 2/1999 |
| JP | 11-118925 | 4/1999 |
| JP | 2000-56018 | 2/2000 |
| JP | 2000-315299 | 11/2000 |

* cited by examiner

Primary Examiner—Thomas H. Tarcza
Assistant Examiner—Brian Andrea
(74) Attorney, Agent, or Firm—Posz & Bethards, PLC

(57) ABSTRACT

A laser radar system is provided which is designed to emit a laser beam through a selected one of laser-emitting windows to scan a given area within a radar zone in a single scan cycle. If the object is detected as having been moved vertically, the radar system works to switch the selected laser-emitting window to another so as to acquire the target at a fixed position within the scanned area of the radar zone at all the time.

12 Claims, 15 Drawing Sheets

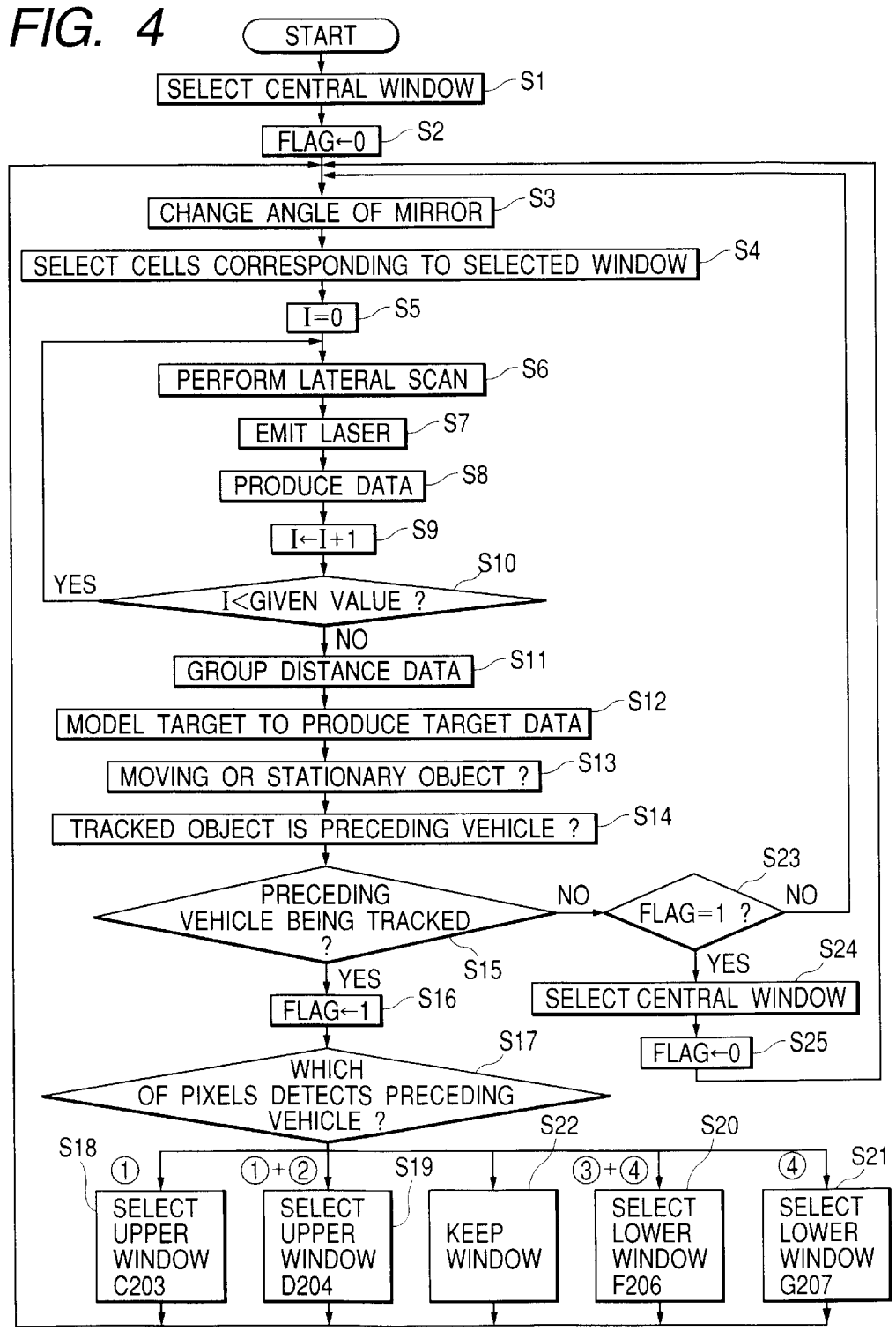

SELECT ONLY CELL ON WHICH RADAR
RETURN IS EXPECTED TO FALL

⇩ SIMULTANEOUS EMISSION

A # OPTICAL OBJECT DETECTING APPARATUS DESIGNED TO SELECTIVELY SHIFT LIGHT EMITTING WINDOW

BACKGROUND OF THE INVENTION

1. Technical Field of the Invention

The present invention relates generally to an optical object detecting apparatus such as a laser radar designed to emit and sweep a laser beam through a selected one of light-emitting windows and to receive a return of the laser beam from an object to produce data on the type of and/or distance to the object.

2. Background Art

FIG. 12(a) shows a conventional automotive laser radar designed to emit laser beams intermittently over an angular range embracing an automobile and receive a return of the laser beam to detect a reflective object. This type of radar may be used with an optical distance measuring system designed to measure the mount of time required by the laser beam to travel to and return from an object to determine the distance to the object.

It is advisable for such distance measuring systems to obtain two-dimensional information about a target over a wider range, that is, to broaden an area scanned by laser beams for increasing a detectable range. The broadening of the scan area, however, requires changing a direction of emission of the laser beam two-dimensionally. Specifically, both a lateral scan mechanism working to sweep the laser beam over a lateral angular range in a width-wise direction of the automobile and a vertical san mechanism working to sweep the laser beam over a vertical angular range in a height-wise direction of the automobile are needed, thus resulting in a complex structure of the system. For example, in a case where the laser beam is swept by a reflective mirror such as a polygon mirror 106, as shown in FIG. 12(b), it needs a complex bi-directional rotary mechanism working to rotate the polygon mirror 106 in the width-wise and height-wise directions of the automobile.

In order to avoid the above problem, Japanese Patent First Publication Nos. 2000-56018 (equivalent to U.S. Pat. No. 6,301,003 B1 assigned to the same assignee as that of this application) and 7-198850 teach a distance measuring apparatus capable of acquiring two-dimensional information about a target using a simple control mechanism. The acquisition of the two-dimensional information is achieved by scanning a laser beam one-dimensionally and at the same time selectively activating light-sensitive cells according to the location of the target in a direction (i.e., a height-wise direction of the vehicle) perpendicular to the scanning direction. Specifically, the apparatus works to shape the laser beam so as to have a rectangular cross section covering a selected vertical angle of a total laser-emitting range (i.e., a radar detectable range) and swing it only in a lateral direction (i.e., the width-wise direction of the vehicle). The apparatus performs the scan in the lateral direction several times and selectively activates the light-sensitive cells every scan, thereby determining the distance to the target.

The above type of laser radar requires increasing a vertical view and a maximum measurable distance in order to continue tracking a preceding vehicle (i.e., a target) correctly even if the preceding vehicle or the radar itself undergoes vertical movements arising from undulations of a road, for example. The increasing of the vertical view requires increasing a vertical range of emission of the laser beam, that is, increasing the size of the cross section of the laser beam in the vertical direction. The increasing of the size of the laser beam, however, results in a drop in emission power density thereof, which leads to a decrease in distance measurable range. Assuring a desired distance measurable range requires an increase in power consumption of the apparatus.

The two-dimensional scan system is capable of tracking the preceding vehicle easily even if it moves vertically, but however, needs to process data about the whole of the radar range, thus resulting in an increase in operating load of the system.

SUMMARY OF THE INVENTION

It is therefore a principal object of the present invention to avoid the disadvantages of the prior art.

It is another object of the present invention to provide an optical object detecting apparatus such as a laser radar capable of scanning a required minimum area through one-dimensional mechanical scans of light to track an object accurately even if it has moved vertically without bringing about increases in operational load and power consumption of the apparatus.

According to one aspect of the invention, there is provided an object detecting apparatus which may be used as an automotive anti-collision system. The object detecting apparatus comprises: (a) a laser emitter emitting a laser beam; (b) a laser scanner designed to swing the laser beam emitted from the laser emitter in a first direction in a cycle within a given object detection zone, the laser scanner being also designed to move in a second direction substantially perpendicular to the first direction, the laser beam having a cross section which is elongated in the second direction so as to scan an area selected within the object detection zone in one scan cycle; (c) a light-sensitive sensor, when activated, sensitive to a return of the laser beam from a reflective object present in the object detection zone to produce a signal for acquiring given information on the object, the light-sensitive sensor including a plurality of light-sensitive cells arrayed adjacent to each other in the second direction; (d) a selecting circuit working to select ones of the light-sensitive cells to be activated in sequence one in each scan cycle of the laser beam; and (e) an area shifting circuit working to determine a position of the object in the second direction within the selected area using the signal outputted from the light-sensitive sensor and move the laser scanner to shift the selected area in the second direction within the object detection zone based on the position of the object.

In the preferred mode of the invention, the laser emitter includes a multi-stripe semiconductor laser which has a plurality of discrete light-emissive areas formed in a single emission layer. The light-emissive areas is activatable to emit laser beams, respectively, which has a total sectional area elongated in the second direction so as to scan the area selected within the object detection zone in each scan cycle.

The apparatus further comprises a distance determining circuit working to measure a time the laser beam takes to travel to and return from the object to determine a distance to the object.

The selecting circuit switches between the light-sensitive cells every scan cycle of the laser beam.

The selecting circuit works to select a given number of the light-sensitive cells corresponding to the area selected within the object detection zone to be activated, one for each scan cycle of the laser beam.

The area shifting circuit works to move the laser scanner to shift the selected area in the second direction within the object detection zone so as to acquire the object at a fixed position within the selected area at all times.

According to the second aspect of the invention, there is provided an object detecting apparatus which comprises: (a) a laser emitter emitting a laser beam; (b) a laser scanner designed to swing the laser beam emitted from the laser emitter in a first direction in a cycle within a given object detection zone, the laser scanner being also designed to move in a second direction substantially perpendicular to the first direction, the laser beam having a cross section which is elongated in the second direction so as to scan an area selected within the object detection zone in a single scan cycle; (c) a light-sensitive sensor, when activated, sensitive to a return of the laser beam from a reflective object present in the object detection zone to produce a signal for acquiring given information on the object, the light-sensitive sensor including a plurality of first arrays of light-sensitive cells aligned in the first direction and a plurality of second arrays of light-sensitive cells aligned in the second direction; (d) a selecting circuit working to selecting a given number of the light-sensitive cells to be activated in each scan cycle of the laser beam; and (e) an area shifting circuit working to determine a position of the object in the second direction within the selected area using the signal outputted from the light-sensitive sensor and move the laser scanner to shift the selected area in the second direction within the object detection zone based on the position of the object.

In the preferred mode of the invention, the apparatus further comprises a distance determining circuit working to measure a time the laser beam takes to travel to and return from the object to determine a distance to the object.

The area shifting circuit works to move the laser scanner to shift the selected area in the second direction within the object detection zone so as to acquire the object at a fixed position within the selected area at all times.

According to the third aspect of the invention, there is provided an object detecting apparatus which comprises: (a) a laser scanner designed to swing a laser beam in a first direction in a cycle within a given object detection zone, the laser scanner being also designed to move in a second direction substantially perpendicular to the first direction; (b) a laser emitter including laser emitting elements arrayed in the second direction, each of the laser emitting elements working to output a laser beam to the laser scanner; (c) a light-sensitive sensor sensitive to a return of the laser beam from a reflective object present in the object detection zone to produce a signal for acquiring given information on the object; (d) a selecting circuit working to switch between the laser emitting elements of the laser emitter in the second direction in each scan cycle of the laser beam; and (e) an area shifting circuit working to determine a position of the object in the second direction within the selected area using the signal outputted from the light-sensitive sensor and move the laser scanner to shift the selected area in the second direction within the object detection zone based on the position of the object.

In the preferred mode of the invention, the apparatus further comprises a distance determining circuit working to measure a time the laser beam takes to travel to and return from the object to determine a distance to the object.

The laser emitter includes a multi-stripe semiconductor laser.

BRIEF DESCRIPTION OF THE DRAWINGS

The present invention will be understood more fully from the detailed description given hereinbelow and from the accompanying drawings of the preferred embodiments of the invention, which, however, should not be taken to limit the invention to the specific embodiments but are for the purpose of explanation and understanding only.

In the drawings:

FIG. 4 is a program performed to switch between light-emitting windows upon vertical movement of a target;

DESCRIPTION OF THE PREFERRED EMBODIMENTS

Figure 1A:
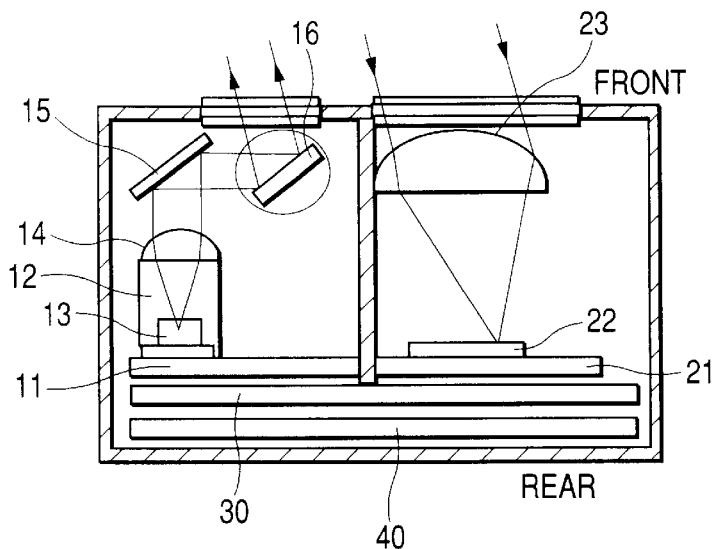
FIG. 1(a) is a sectional view which shows a laser radar sensor according to the invention.
Figure 1B:
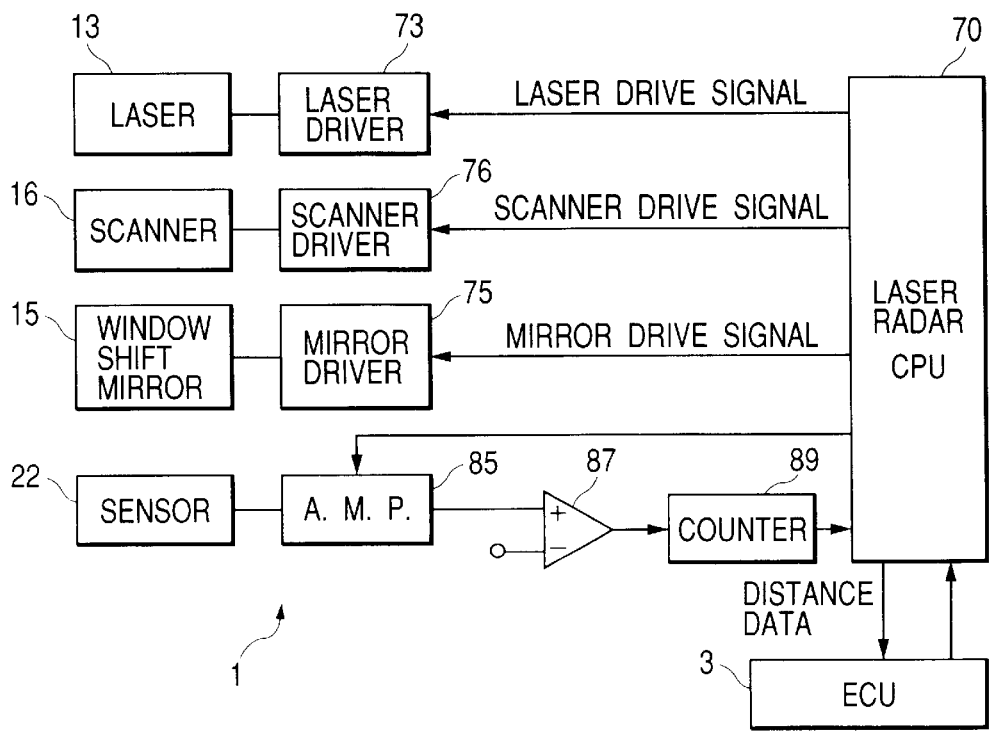
FIG. 1(b) is a block diagram which shows an automotive control system equipped with the laser radar sensor of FIG. 1(a)

Referring now to the drawings, like reference numbers refer to like parts throughout several views, particularly to FIGS. 1(a) and 1(b), there is shown an automotive control system with which the invention is used. The control system will be discussed below, as an example, as being installed in an automotive vehicle (will also be referred to as a system vehicle below) and working as an anticollision radar system to track reflective objects such as vehicles traveling ahead or obstacles and output an alarm when the tracked object falls within a given alarm zone and meets selected conditions or control the speed of the system vehicle so as to follow the preceding vehicle.

The control system, as clearly shown in FIG. 1(b), includes an electronic control unit (ECU) 3 working to detect or identify a target and control the distance between the system vehicle and a preceding vehicle traveling ahead of the system vehicle if tracked as the target. The ECU 3 is made up of a microcomputer, an input/output interface, drivers, and a detecting circuit. The hardware of theses parts is well known in the art, and explanation thereof in detail will be omitted here.

The ECU 3 receives distance data on a target from a laser radar sensor 1 and outputs control data thereto. The ECU 3 also receives control parameters produced by a vehicle speed sensor, a brake switch, and a throttle position sensor (not shown) and outputs drive signals to an alarm sound generator, a distance display, a sensor malfunction indicator, a brake actuator, a throttle actuator, and an automatic transmission controller (not shown). The ECU 3 also connects with a cruise control switch, a steering sensor, and a yaw rate sensor (not shown).

The laser radar sensor 1 is made up of two major parts: an optical unit designed to emit a laser beam and receive a laser return from an object and a distance measuring unit designed to measure the time the laser beam takes to travel to the object and back to determine the distance to the object. The optical unit, as clearly shown in FIG. 1(a), consists of a light-emitting substrate 11, a light-emitting module 12, a laser-emitting window shifting mirror 15, and a lateral scanner 16. The light-emitting module 12 consists of a semiconductor laser diode 13 working to emit a laser beam in a cycle in the form of a pulse, a light-emitting lens 14, and a diaphragm (not shown).

Figure 12A:
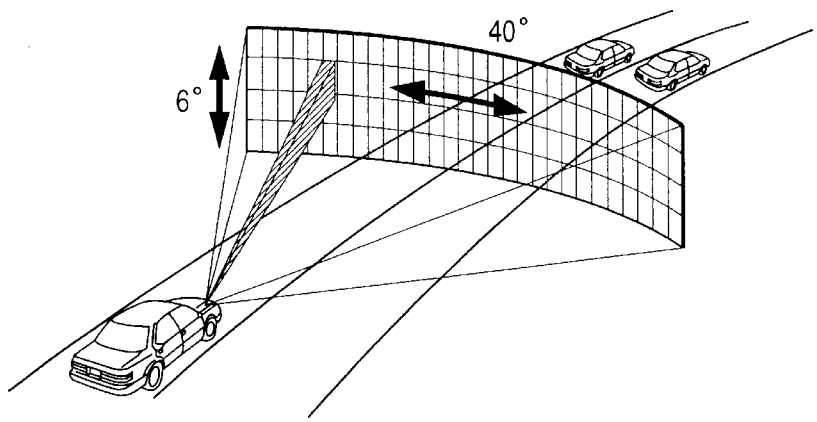
FIG. 12(a) is a perspective view for explaining a total laser-emitting range.
Figure 12B:
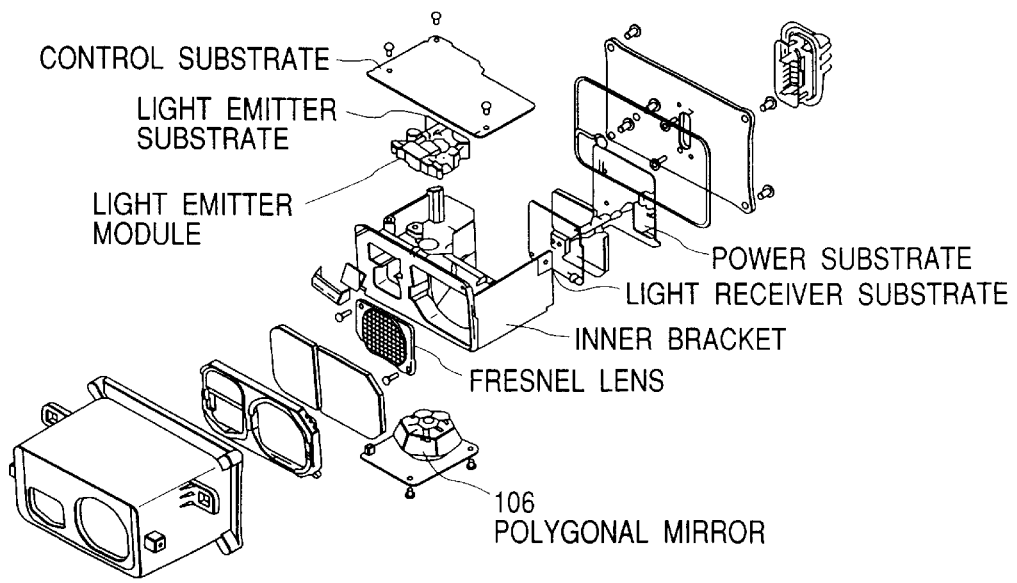
FIG. 12(b) is an exploded perspective view which shows an internal structure of a conventional two-dimensional scanning radar.

The semiconductor laser diode 13 is connected to a laser radar CPU 70, as shown in FIG. 1(b), mounted on a control substrate 30 through a laser driver 73 mounted on the light-emitting substrate 11 and responsive to a trigger signal from the laser radar CPU 70 to emit laser beams. The control system also includes a power supply substrate 40 disposed adjacent the control substrate 30 which supplies the power to several component parts of the system. The laser beam emitted from the laser diode 13 is reflected by the laser-emitting window shifting mirror 15 and the lateral scanner 16 and outputted outwardly over a frontal detection zone that is, as shown in FIG. 12(a), a rectangular field defined by a vertical angle of 6° (i.e., a height-wise direction of the system vehicle) and a lateral angle of 40° (i.e., a width-wise direction of the system vehicle).

The lateral scanner 16 has disposed therein a mirror which is swung laterally to scan the laser beam over 40° in the width-wise direction of the system vehicle, thereby ensuring a desired lateral radar field of view and lateral radar resolution. The lateral swing of the mirror may be achieved by installing the mirror to be rotatable about a shaft extending in the height-wise direction of the system vehicle and energizing a coil to move a small-sized permanent magnet installed on the mirror. The coil and magnet constitute an electric motor which is actuated by a drive signal outputted from the laser radar CPU 70 through a scanner driver 76. The angular position of the motor is detected by a motor position sensor (not shown) and inputted into the laser radar CPU 70.

A 6° vertical radar field of view is established by shaping the laser beam outputted by the laser diode 13 and actuating the laser-emitting window shifting mirror 15. Specifically, the laser beam emerging from the laser diode 13 is first shaped by the diaphragm into a beam having a vertically elongated cross section which is further extended vertically by the light-emitting lens 14. The thus formed laser beam has a cross section covering a vertical angle of 2°. The laser-emitting window shifting mirror 15 is installed to be rotatable about a support shaft extending horizontally and swung vertically by an electric motor (not shown) which is actuated by a drive signal inputted from the laser radar CPU 70 through a mirror driver 75, thereby radiating the laser beam over a vertical angle of 6°.

Figure 2A:
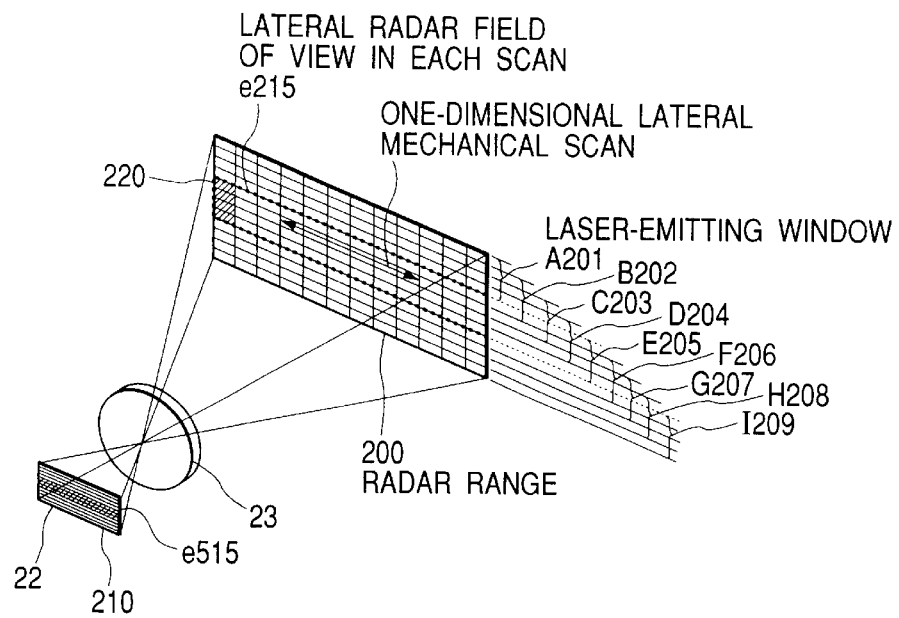
FIG. 2(a) is a perspective view for explaining selection of laser-emitting windows and light-sensitive pixels of a light-sensitive sensor when it is required to scan a central portion of a radar range.
Figure 3A:
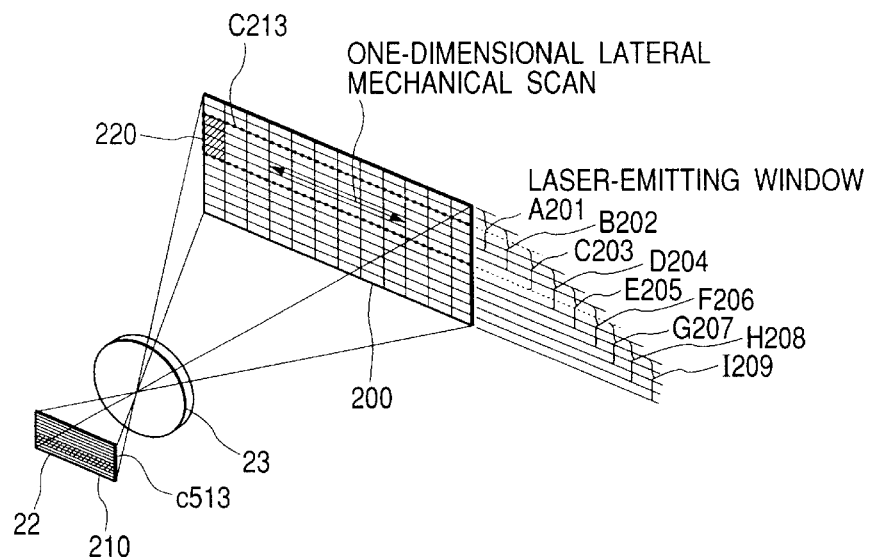
FIG. 3(a) is a perspective view for explaining selection of laser-emitting windows and light-sensitive pixels of a light-sensitive sensor when it is required to shift a scanned portion of a radar range upward.
Figure 3B:
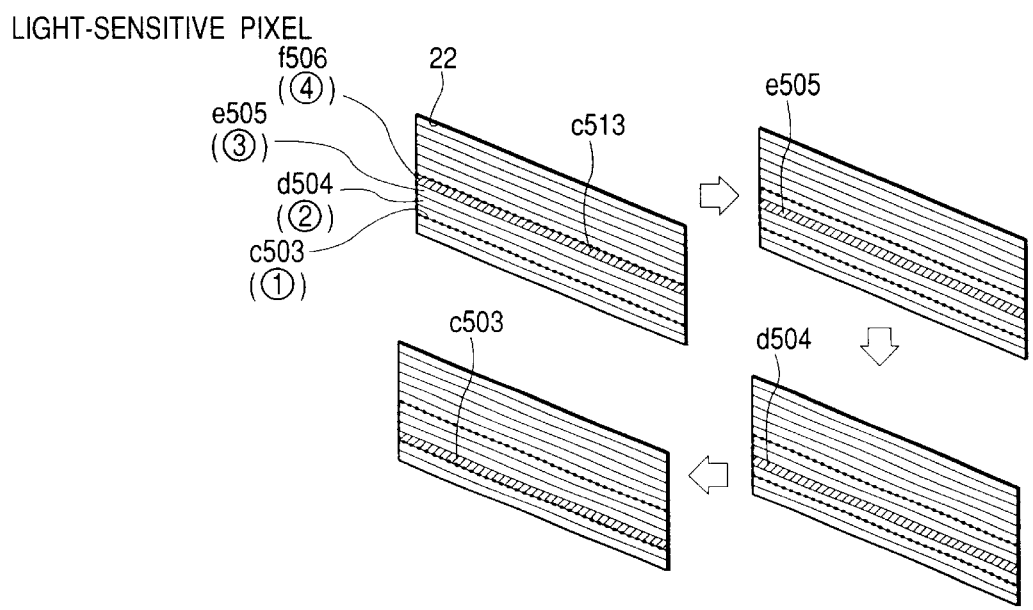
FIG. 3(b) is a perspective which shows sequential switching of light-sensitive pixels of a light-sensitive sensor when it is required to shift a scanned portion of a radar range upward.

Specifically, the laser radar CPU 70 controls the movement of the laser-emitting window shifting mirror 15 to swing the laser beam over an angular range of 2°×40° in each scan cycle that is the part of the total laser-emitting range 200 (also called a radar detectable range below), as shown in FIG. 2(a), defined by a vertical angle of 6° and a lateral angle of 40° based on the concept that it is not always necessary to scan the whole of the vertical radar field of view in the total laser-emitting range 200. For example, if a preceding vehicle is tracked as a target and determined as having moved vertically, the laser radar CPU 70 moves the laser-emitting window shifting mirror 15 to shift a lateral radar field of view e215 vertically so that the preceding vehicle may be acquired substantially at the center of a laser-scanned area at all times. For example, the laser-emitting window shifting mirror 15 is moved to shift a central one of laser-emitting windows A201 to I209, that is, the laser-emitting window E205 to the laser-emitting window C203 that is, as shown in FIG. 3(a), two windows higher than the central laser-emitting window E205. Specifically, in an initial stage of a scanning operation, the laser beam 220 having a rectangular cross section ranging over 2° in the vertical direction is first swung one time only in the lateral direction to establish the lateral radar field of view e251 as one of the laser-emitting windows A201 to I209. When the ECU 3 commands the laser radar CPU 70 to shift the lateral radar field of view e251, the laser radar CPU 70 changes a vertical angular position of the laser-emitting window shifting mirror 15 through the mirror driver 75 to emit the laser beam through another of the laser-emitting windows A201 to I209.

Figure 2B:
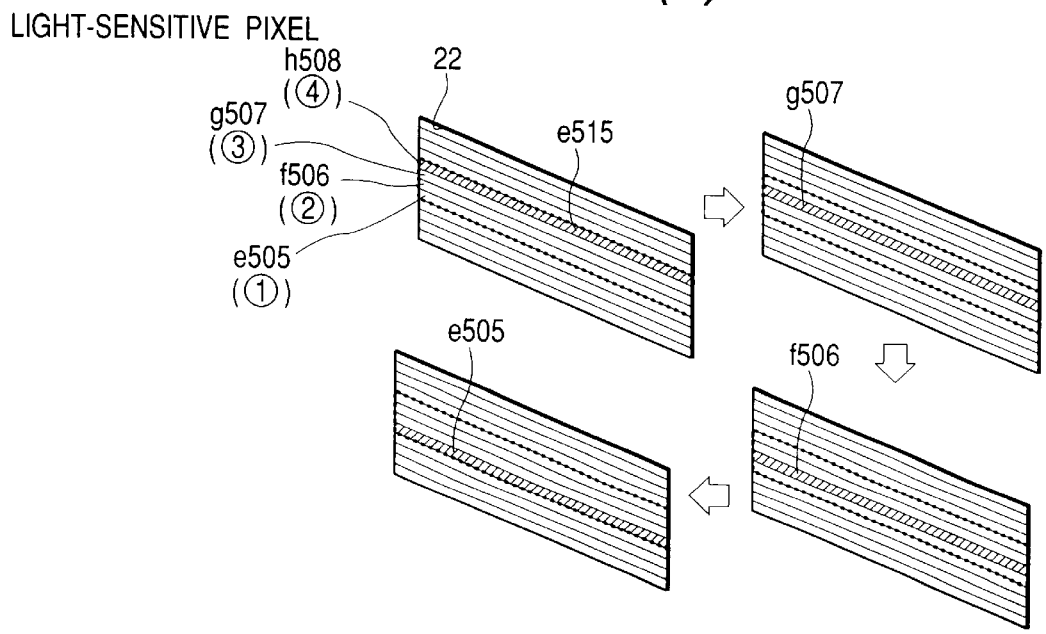
FIG. 2(b) is a perspective which shows sequential switching of light-sensitive pixels of a light-sensitive sensor when it is required to scan a central portion of a radar range.

Referring back to FIGS. 1(a) and 1(b), the optical unit also includes a light-receiver made up of a light-receiving circuit substrate 21, a light-sensitive sensor 22, and a light-receiving lens 23. The light-receiving lens 23 gathers an incoming light and directs it onto a light-sensitive surface of the light-sensitive sensor 22. The light-sensitive sensor 22 is installed on the light-receiving circuit substrate 21 and constructed as a one-dimensional sensor which is made of discrete light-sensitive cells formed by photodiodes. The cells, as can be seen from FIGS. 2(a) and 2(b), each extend in the lateral direction (i.e., the width-wise direction of the system vehicle) and are laid adjacent each other in the vertical direction (i.e., the height-wise direction of the system vehicle). In the case shown in FIG. 2(b), the twelve cells are arrayed in parallel in the vertical direction and work to scan the total laser-emitted range 200 divided into a matrix of 12×12 sections. Each of the cells works to produce an output changing in response to varying intensity of a pulse-like laser beam falling thereon.

The outputs of the light-sensitive sensor 22 are inputted into a variable amplifier 85. The variable amplifier 85 works to amplify the input and provides a voltage output to a comparator 87. The amplification factor of the variable amplifier 85 is so controlled as to increase with time. An increase in the amplification factor is controlled by the laser radar CPU 70. The comparator 87 compares the voltage input from the variable amplifier 85 with a reference voltage and outputs the voltage input to a time counter 89 as a stop pulse signal PB when it exceeds the reference voltage. The voltage outputs from the light-sensitive sensor 22 may also be changed in amplitude to a selected level using an STC (sensitivity-time control) circuit prior to input to the variable amplifier 85. Usually, the intensity of a received signal (i.e., the input to the light sensitive sensor 22) is inversely proportional to the distance to a target to the fourth power, therefore, if an object having a high reflectivity such as a reflector is present at short range, it will cause the intensity of the received signal to be increased. The STC circuit is effective in compensating for the increase in intensity of the received signal.

To time counter 89, the drive signal provided from the laser radar CPU 70 to the laser driver 73 is also inputted as a start pulse signal PA. The time counter 89 codes a phase difference (i.e., a difference ΔT between a time T0 when the laser beam was emitted and a time T1 when a return of the laser beam was received) between the pulse signals PA and PB into a binary digital signal and outputs it to the laser radar CPU 70. The time counter 89 also measures the width of the stop pulse signal PB and outputs a binary digital signal indicative thereof to the laser radar CPU 70. The time counter 89 is capable of converting micro-time intervals into numerical quantities so that even if a plurality of radar echoes are received for a single shot of a laser beam, a time difference of each of the received light signals may be determined. U.S. Pat. No. 6,301,003 B1, assigned to the same assignee as that of this application teaches an operation of a time counter built in a laser radar which may be employed in this embodiment, disclosure of which is incorporated herein by reference.

The laser radar CPU 70 calculates the distance to a tracked object based on the phase difference (i.e., the time difference between the pulse signals PA and PB) derived by the time counter 89 and produce positional data on the object using the distance and a corresponding scan angle when the laser beam was outputted. Specifically, laser radar CPU 70 defines therein an x-y rectangular coordinate system in which an origin lies at the center of this system (i.e., the center of the laser radar sensor 1), and x and y axes extend in the width-wise and length-wise directions of the system vehicle, respectively, and transforms the positional data on the object into x and y coordinates. The laser radar CPU 70 outputs the coordinates (x, y) of the object and the intensity of light received by the light-sensitive sensor 22 (i.e., the pulse width of the stop pulse signal PB) to the ECU 3 as a distance data. For example, if the scan cycle of the laser radar sensor 1 is 100 msec., the laser radar CPU 70 outputs the distance data at an interval of 100 msec.

The ECU 3 identifies the object using the distance data outputted from the laser radar CPU 70. If the object is identified as a preceding vehicle traveling ahead of the system vehicle, the ECU 3 outputs control signals to the brake actuator, the throttle actuator, and the automatic transmission controller (not shown) to control the speed of the system vehicle, thereby adjusting the distance between the system vehicle and the preceding vehicle to a selected one. The ECU 3 also outputs an alarm signal if it is determined that an object such as a vehicle traveling or parked ahead of the system vehicle lies within a given alarm zone for a preselected period of time. When detecting movement of the tracked vehicle upward or downward of the lateral radar field of view e215, the ECU 3 commands the laser radar CPU 70 to shift the lateral radar field of view e215 vertically so that the tracked vehicle may lie substantially at the center of the lateral radar field of view e215.

FIG. 4 shows a sequence of logical steps or program performed by the laser radar CPU 70 and the ECU 3 to shift the laser-emitting window as a function of vertical movement of an object such as a preceding vehicle.

After entering the program, the routine proceeds to step 1 wherein a central one of the laser-emitting windows A201 to I209, as shown in FIG. 2(a), that is, the laser-emitting window E205 is selected through which the laser beam is to be emitted. The routine proceeds to step 2 wherein a tracking flag is set to zero (0). The routine proceeds to step 3 wherein the laser-emitting window shifting mirror 15 is moved through the mirror driver 75 to change a vertical angle thereof, as will be described later in detail. The routine proceeds to step 4 wherein ones of the light-sensitive cells of the light-sensitive sensor 22 corresponding to one of the laser-emitting windows A201 to I209, as selected in this program cycle, are selected as being activated in following steps. In the first program cycle, ones of the light-sensitive cells of the light-sensitive sensor 22 corresponding to the central laser-emitting windows E205 selected in step 1 are selected. Operations in steps 3 and 4 are, thus, unchanged.

After step 4, the routine proceeds to step 5 wherein a variable I is set to zero (0). The routine proceeds to step 6 wherein the scanner driver 76 is actuated to initiate the swing of the lateral scanner 16. The routine proceeds to step 7 wherein the laser driver 73 is turned on to initiate emission of a laser beam from the laser diode 13, and the CPU 70 activates one of the light-sensitive cells of the light-sensitive sensor 22 selected in step 4. The routine proceeds to step 8 wherein the laser radar CPU 70 produces the distance data, as described above, using an output of the light-sensitive sensor 22. The routine proceeds to step 9 wherein the variable I is incremented by one (1) (i.e., I=I+1). The routine proceeds to step 10 wherein it is determined whether the variable I is smaller than a predetermined value or not. If a YES answer is obtained, then the routine proceeds to step 6.

The operations in steps 5 to 10 will be described below in more detail. For instance, if the central laser-emitting window E205 is selected in step 1, ones of the light-sensitive cells of the light-sensitive sensor 22 corresponding to the central laser-emitting windows E205, that is, a laser-sensitive area e515 of the light-sensitive sensor 22, as shown in FIG. 2(a), is activated as a radar field of view established by one lateral scan of the laser beam. The activation of the laser-sensitive area e515 is achieved by switching between four light-sensitive pixels h508 (④), h507 (③), f506 (②), and e505 (①), which define the laser-sensitive area e515, from h508 (④) to g507 (③) to f506 (②) and to e505 (①), in sequence, on scan basis. Therefore, steps 6 to 10 are repeated until it is determined in step 10 that the variable I has reached four (4). Specifically, the lateral scan of the laser beam is performed each time one of the light-sensitive pixels h508 to e505 is switched to another to produce the distance data for each of predetermined discrete scan angles θ (e.g., 12 scan angles in the lateral direction in FIG. 2(a)).

Figure 5A:
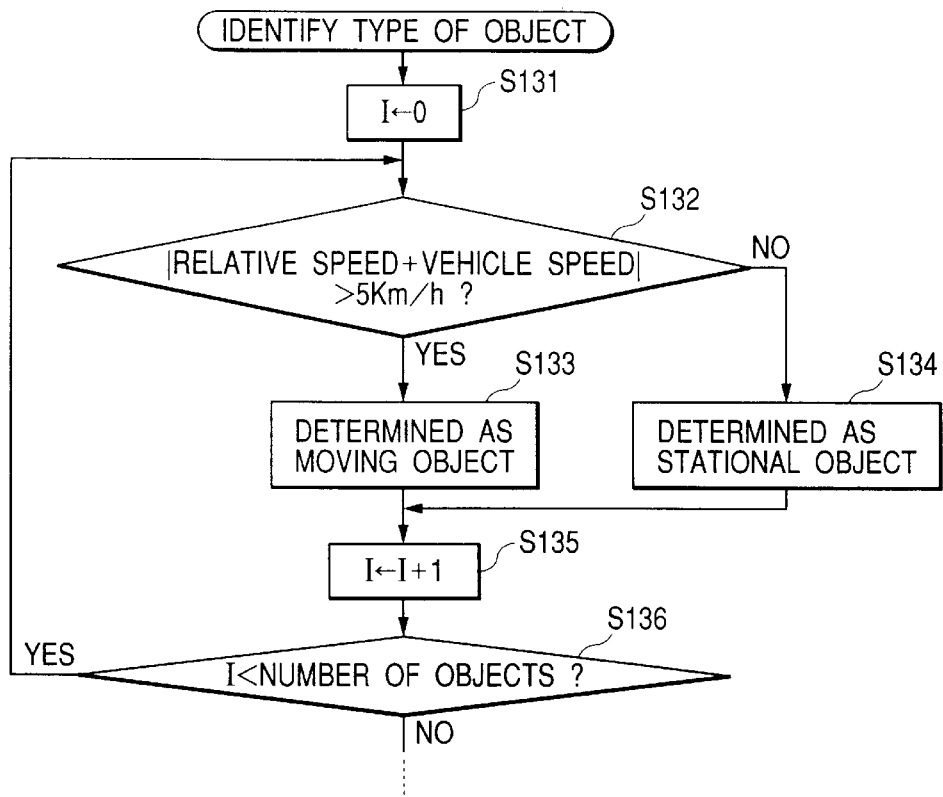
FIG. 5(a) is a sub-program executed to identify the type of a target.
Figure 5B:
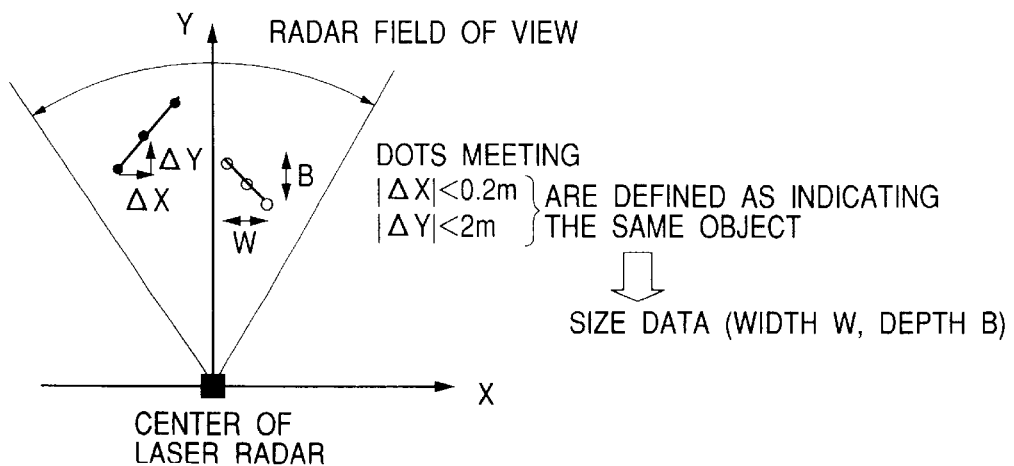
FIG. 5(b) is an illustration for explaining grouping of distance data and target modeling.

After the four light-sensitive pixels h508 to e505 of the laser-sensitive area e515 all have been activated in sequence, and the distance data and the scan angles θ for each of the light-sensitive pixels h508 to e505 have been derived, the routine proceeds to step 11 wherein a grouping operation is performed on the distance data which will be described below with reference to FIG. 5(b). The distance data and their scan angles θ are transformed from polar coordinates to x-y rectangular coordinates, as described above, to produce object data. The object data are grouped to form segments. Specifically, ones of the object data, as represented as points in the x-y rectangular coordinate system, each of which meets two conditions that the distance ΔX to an adjacent one of the object data in an x-axis direction is less than or equal to 0.2 m, and the distance ΔY to the adjacent object data in a y-axis direction is less than or equal to 2 m are collected as a group to produce segment data. The segment data is defined by a rectangular area which is surrounded by lines extending in parallel to the x- and y-axes in the rectangular coordinate system and which contains all object data in each group. Each segment data contains parameters indicating x and y coordinates of the center of a corresponding one of the rectangular areas and lengths W and B of two sides of the rectangular area extending along the x- and y-axes of the rectangular coordinate system (i.e., the width and depth of the rectangular area).

After the segment data is derived in step 11, the routine proceeds to step 12 wherein a target is modeled to produce target data using the segment data. Specifically, x and y coordinates of the center of the rectangular area (i.e., a tracked object) defined in the rectangular coordinate system and lengths W and B thereof are defined as the target data. Changes in the x and y coordinates of the center of the tracked object with time are measured to determine the speed (Vx, Vy) of the object relative to that of the system vehicle.

The routine proceeds to step 13 wherein it is determined whether each tracked object is a stationary or a moving object. The operation in step 13 will be described in more detail with reference to FIG. 5(a). First, in step 131, the variable I is set to zero (0). The routine proceeds to step 132 wherein it is determined whether an absolute value of the sum of the relative speed of a first one of the tracked objects and the speed of the system vehicle is greater than 5 km/h or not. If a YES answer is obtained, then the routine proceeds to step 133 wherein the object is determined to be moving. Alternatively, if a NO answer is obtained, then the routine proceeds to step 134 wherein the object is determined to be stationary. After step 133 or 134, the routine proceeds to step 135 wherein the variable I is incremented by one (1). The routine proceed to step 136 wherein it is determined whether the variable I is less than a total number of the tracked objects or not. If a YES answer is obtained, then the routine returns back to step 132 wherein the above described operation is performed on a second one of the tracked objects. Alternatively, if a NO answer is obtained, then the routine returns back to the program of FIG. 4 and proceeds to step 14.

In step 14, it is determined whether each of the tracked objects is a preceding vehicle which would obstruct traveling of the system vehicle or not based on the type of the object, the central position of the object, and a frontal radar range as determined as a function of a steered angle of the system vehicle.

The routine proceeds to step 15 wherein it is determined whether a preceding vehicle is being tracked or not. If a YES answer is obtained, then the routine proceeds to step 16 wherein the tracking flag is set to one (1). The routine proceed to step 17 wherein it is determined which of the light-sensitive pixels h508 (④), h507 (③), f506 (②), and e505 (①) defining the laser-sensitive area e515 detects the preceding vehicle determined in step 15 as being tracked.

For example, if the central laser-emitting window E205 is now used, and a radar echo from the preceding vehicle falls on central two of the light-sensitive pixels h508 to e505 of the laser-sensitive area e515, that is, the light-sensitive pixels g507 and f506, the laser radar CPU 70 determines that the laser radar sensor 1 is tracking the preceding vehicle properly and keeps the central laser-emitting window E205 as it without switching it to another.

If the radar echo from the preceding vehicle has been shifted to either of an upper and a lower side of the light-sensitive pixels g507 and f506, that is, the light-sensitive pixels h508 and e505, the CPU 70 determines that the preceding vehicle has moved vertically and shifts or switches the laser-emitting window E205 to another so that one of the light-sensitive pixels h508 and e505 on which the radar echo falls may lie at the center of the switched laser-emitting window. For instance, if the radar echo falls only on the lowermost light-sensitive pixel e505 of the laser-sensitive area e515, then the routine proceeds to step 18 wherein the laser radar CPU 70 selects the laser-emitting window C203 which is the second from the laser-emitting window E205 used so far in the upward direction. If the radar echo falls both on a lower half of the laser-sensitive area e515, that is, the light-sensitive pixels f506 and e505, then the routine proceeds to step 19 wherein the laser radar CPU 70 selects the laser-emitting window D204 which is immediately higher than the laser-emitting window E205 used so far. If the radar echo falls only on the uppermost light-sensitive pixel h508 of the laser-sensitive area e515, then the routine proceeds to step 21 wherein the laser radar CPU 70 selects the laser-emitting window G207 which is the second from the laser-emitting window E205 used so far in the downward direction. If the radar echo falls both on an upper half of the laser-sensitive area e515, that is, the light-sensitive pixels g507 and h508, then the routine proceeds to step 20 wherein the laser radar CPU 70 selects the laser-emitting window F206 which is immediately lower than the laser-emitting window E205 used so far. If the radar echo falls on either or both of central two of the light-sensitive pixels, that is, the light-sensitive pixels g507 and f506, then the routine proceeds to step 22 wherein the laser radar CPU 70 continues selecting the light-emitting window E205 used so far.

After step 18, 19, 22, 20, or 21, the routine proceeds to step 3 wherein the CPU 70 moves the laser-emitting window shifting scanner 15 to switch one of the laser-emitting windows A201 to I209 as used so far to the selected one. For instance, if the laser-emitting window C203 that is the second to the central laser-emitting window E205 in the upward direction, as used so far, is selected in step 18, the laser radar CPU 70 in step 3 changes the vertical angle of the laser-emitting window shifting scanner 15 through the mirror driver 75 to switch the laser-emitting window E205 to the laser-emitting window C203 to establish a lateral radar field of view c213, as shown in FIG. 3(a). The laser radar CPU 70 swings the lateral scanner 16 laterally while emitting a laser beam from the laser diode 13. The laser radar CPU 70 activates, in sequence, rows of the light-sensitive cells of the light-sensitive sensor 22 corresponding to the lateral radar field of view c213, i.e., the four light-sensitive pixels f506, e505, d504, and c503 in this order to output voltage signals to the laser radar CPU 70 through the amplifier 85, the comparator 87, and the time counter 89. The laser radar CPU 70 acquires two-dimensional positional information on a target, e.g., a preceding vehicle located ahead of the system vehicle and finds one or ones of the light-sensitive pixels of the light-sensitive sensor 22 on which a return of the laser beam from the preceding vehicle falls. If the radar return falls on central two of the light-sensitive pixels f506 to c503 of the laser-sensitive area c513, as shown in FIG. 3(a), corresponding to the laser-emitting window C203 now being used, that is, the light-sensitive pixels d504 and e505, the laser radar CPU 70 determines that the preceding vehicle is being tracked properly and continues to measure the distance to the preceding vehicle without changing the laser-emitting window C203.

If the radar return is shifted to the light-sensitive pixels c503 and f507 during tracking of the preceding vehicle, the laser radar CPU 70 decides that the preceding vehicle has moved vertically and switches the laser-emitting window C203 used so far to another so that the radar return may fall on a central one of the light-sensitive pixels of the laser-sensitive area corresponding to the switched laser-emitting window.

If the preceding vehicle has made a turn to the left or right so that it has disappeared from the lane on which the system vehicle is now traveling, that is, from the total laser-emitting range 200, then a NO answer is obtained in step 15 of FIG. 4. The routine, thus, proceeds to step 23 wherein it is determined whether the tracking flag is one (1) or not. In this case, the tracking flag is determined as being one (1). The routine, thus, proceeds to step 24 wherein the laser radar CPU 70 selects a central one of the light-emitting windows A201 to I209 in the total laser-emitting range 200, i.e., the laser-emitting window E205. The routine proceeds to step 25 wherein the tracking flag is set to zero (0) and returns back to step 3. Similarly, if a NO answer is obtained in step 23 meaning that the tracking flag is zero (0), then the routine returns back to step 3.

As apparent from the above discussion, the radar system of this embodiment is designed to scan laser beams laterally only through a portion of the total laser-emitting range 200 to produce, for example, the lateral radar field of view e215, as shown in FIG. 2(a), which ranges over the overall width of the total laser-emitting range 200, but not over the overall height thereof. If it is determined that the target lies out of the center of the lateral radar field of view e215, the radar system moves the laser-emitting window shifting mirror 15 vertically to switch the lateral radar field of view e215 to another so that the target may be tracked at the center of the lateral radar field of view at all times. Specifically, the radar system of this embodiment is capable of continuing tracking, for example, a preceding vehicle traveling ahead of the system vehicle only through a one-dimensional mechanical scan of the selected lateral radar field of view even if the preceding vehicle has moved vertically. Typical two-dimensional scan radar systems need to process data on the whole of a radar range at all the time even if the target stays at the center of the radar range, thus resulting in an increase in operational load of the system. In contrast to this, if the target lies at the center of the radar range, the radar system of this embodiment works to emit laser beams only through the central laser-emitting window E205 and receive a radar return only through the light-sensitive pixels h508 to e505 of the light-sensitive sensor 22 corresponding to the light-emitting window E205, thereby resulting in a decrease in load on processing data on the target. If the target has moved vertically out of the center of the radar range, the radar system switches the central laser-emitting window E205 to another following the movement of the target. Generally, a preceding vehicle traveling ahead of the system vehicle is not subjected to vertical movement frequently in a usual traffic condition. The central laser-emitting window E205 is, thus, expected to be used for a long term, which results in a greatly decreased load on processing data on the preceding vehicle.

The radar system, as described above, works to shift the lateral radar field of view as needed, thereby allowing the vertical length of a laser beam to be decreased as compared with the prior art systems. For instance, emission of a laser beam over the total laser-emitting range 200 in a single scan requires the laser beam to have a vertical length ranging over 6°, thus resulting in a drop in emission power density of the laser beam, which leads to a decrease in maximum radar range. Keeping the maximum radar range results in an increase in power consumption. The radar system of this embodiment, however, requires the laser beam to have a vertical length of no more than 2°, thus ensuring a desired radar range without increasing the power consumption.

Figure 6A:
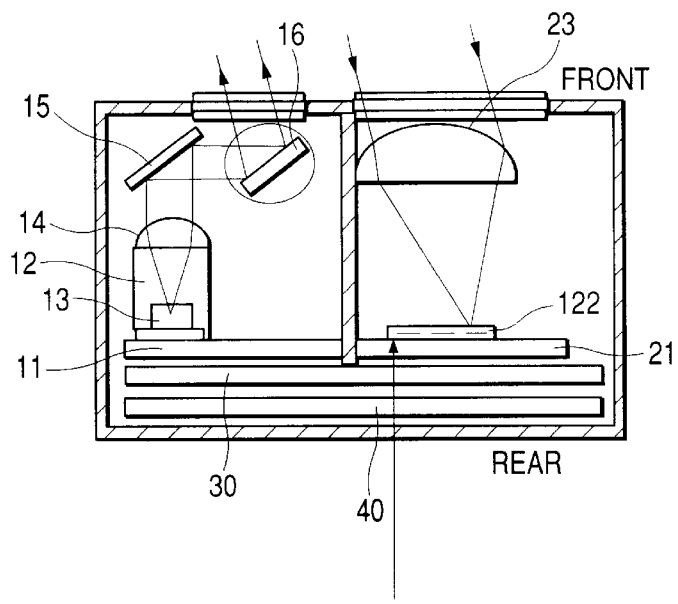
FIG. 6(a) is a sectional view which shows a laser radar sensor according to a first modification of the invention.
Figure 6B:
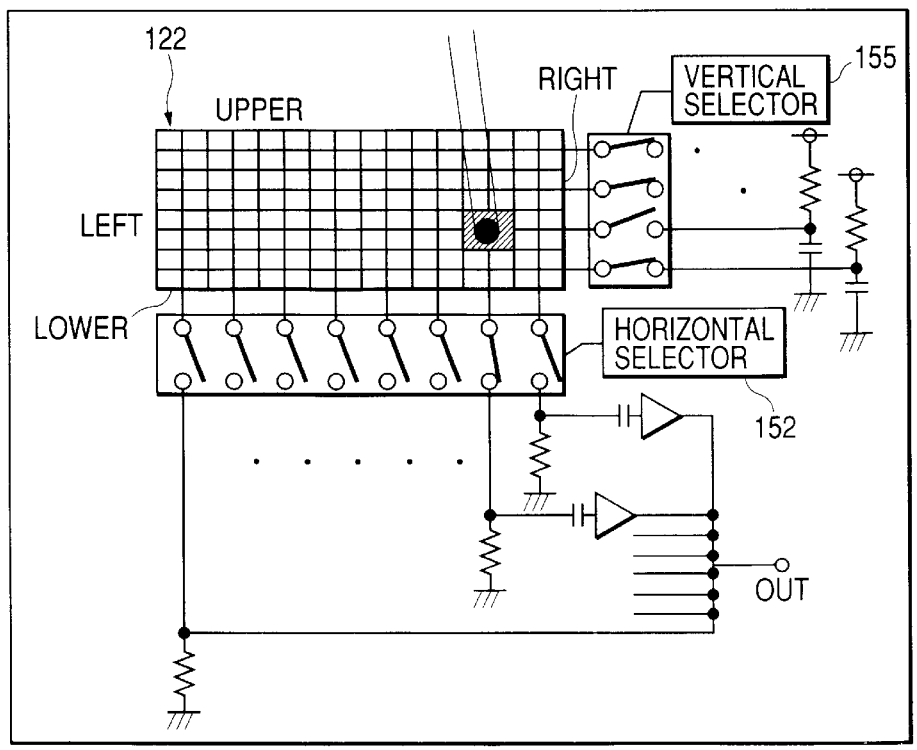
FIG. 6(b) is an illustration which shows a circuit structure for selecting light-sensitive cells arrayed in a matrix.

FIGS. 6(a) and 6(b) show a first modification of the radar system. The same reference numbers as employed in FIGS. 1(a) and 1(b) will refer to the same parts, and explanation thereof in detail will be omitted here.

The radar system includes a light-sensitive sensor 122 instead of the light-sensitive sensor 22 in FIGS. 1(a) and 1(b). The light-sensitive sensor 122 consists of a matrix of light-sensitive cells made of photodiodes. Specifically, the light-sensitive sensor 122 has a two-dimensional structure which is made up of a plurality of horizontal cell arrays extending in the width-wise direction of the system vehicle and a plurality of vertical cell arrays extending in the height-wise direction of the system vehicle. The radar system also includes a vertical cell selector 151 and a horizontal cell selector 152. The vertical cell selector 151 includes, as clearly shown in FIG. 6(b), switches each connected to one of horizontal arrays of the cells of the light sensitive sensor 122 (i.e., one of rows of the matrix). Similarly, the horizontal cell selector 152 includes switches each connected to one of vertical arrays of the cells (i.e., one of columns of the matrix).

The vertical cell selector 151 is capable of setting one or some of the cells of each of the vertical arrays operable each time one laser beam is emitted. The horizontal cell selector 152 is capable of setting one or some of the cells of each of the horizontal arrays operable and switches them, in sequence, from right to left or vice versa in synchronization with a lateral swing of the laser beam (i.e., a change in the scan angle) in each scan cycle of the laser beam. Each of the cells becomes activated only when set operable both by the vertical cell selector 151 and by the horizontal cell selector 152. In practice, the laser radar CPU 70 activates, as clearly shown in FIG. 6(b), only the cell which connects both with the switch opened by the vertical cell selector 151 and with the switch closed by the horizontal cell selector 152. The laser radar CPU 70 is capable of activating at least portion of the light-sensitive sensor 122 as a function of an expected angular direction of the target. This minimizes optical disturbances such as laser light emitted from vehicles running in the opposite direction or adjacent vehicles running in the same direction.

Figure 7A:
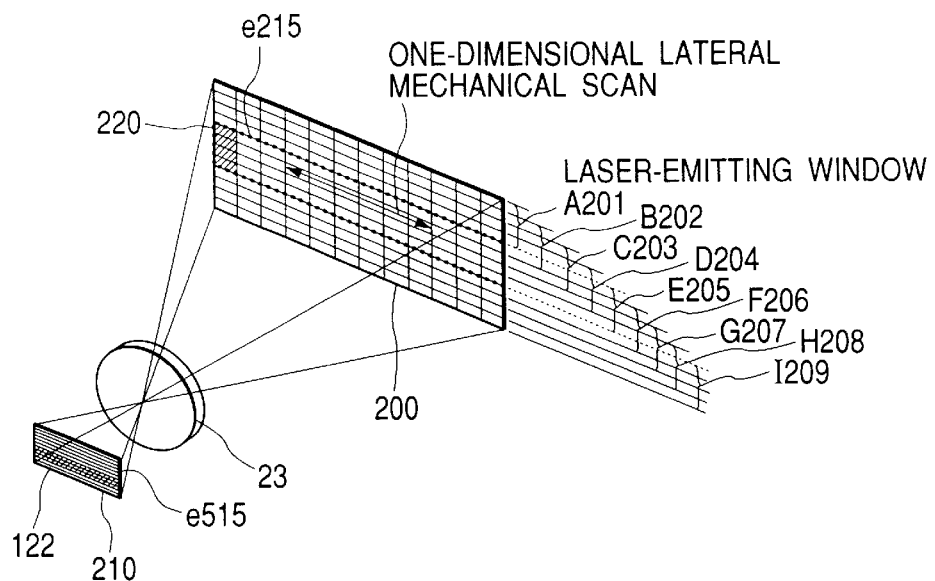
FIG. 7(a) is a perspective view for explaining selection of laser-emitting windows and light-sensitive pixels of a light-sensitive sensor when it is required to scan a central portion of a radar range in the first modification as shown in FIGS. 6(a) and 6(b)
Figure 7B:
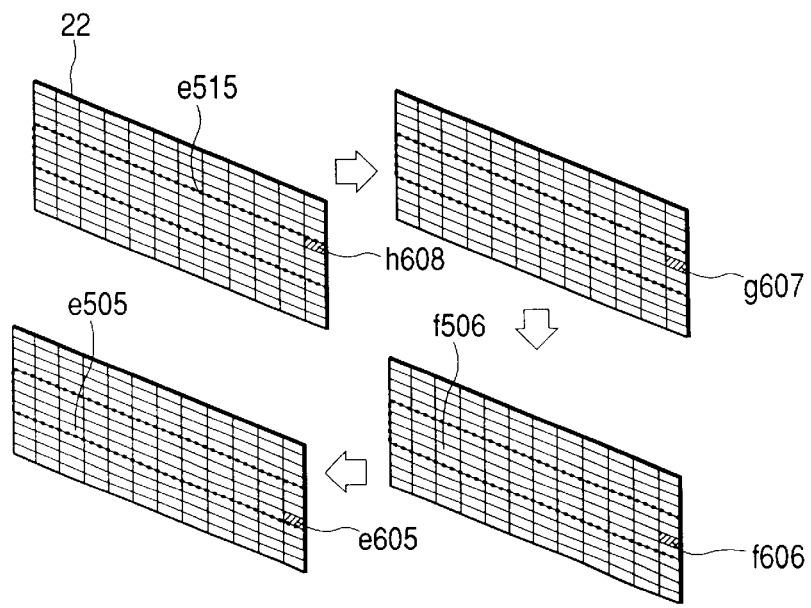
FIG. 7(b) is a perspective which shows sequential switching of light-sensitive pixels of a light-sensitive sensor when it is required to scan a central portion of a radar range in the first modification as shown in FIGS. 6(a) and 6(b)
Figure 8A:
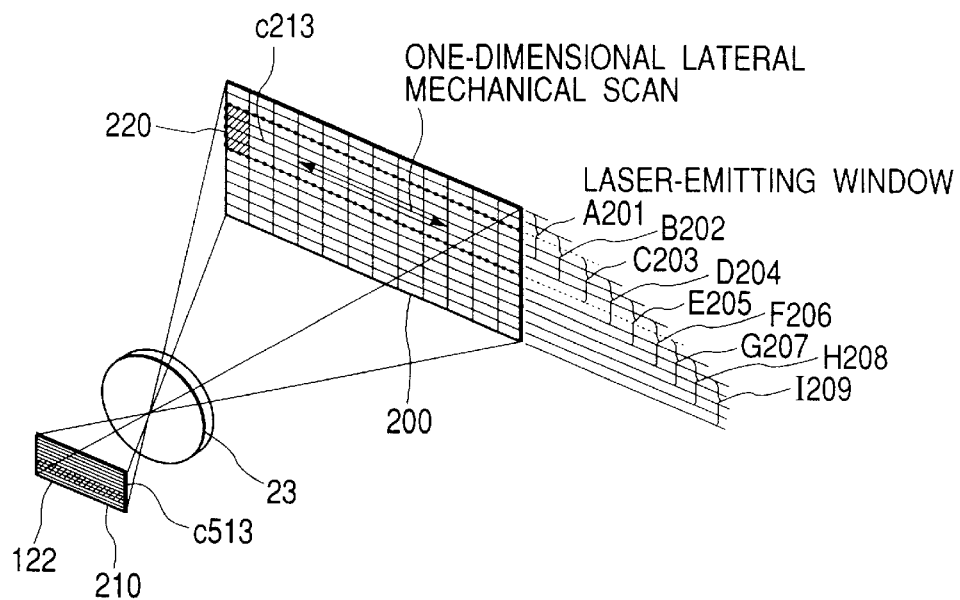
FIG. 8(a) is a perspective view for explaining selection of laser-emitting windows and light-sensitive pixels of a light-sensitive sensor when it is required to shift a scanned portion of a radar range upward in the first modification as shown in FIGS. 6(a) and 6(b)
Figure 8B:
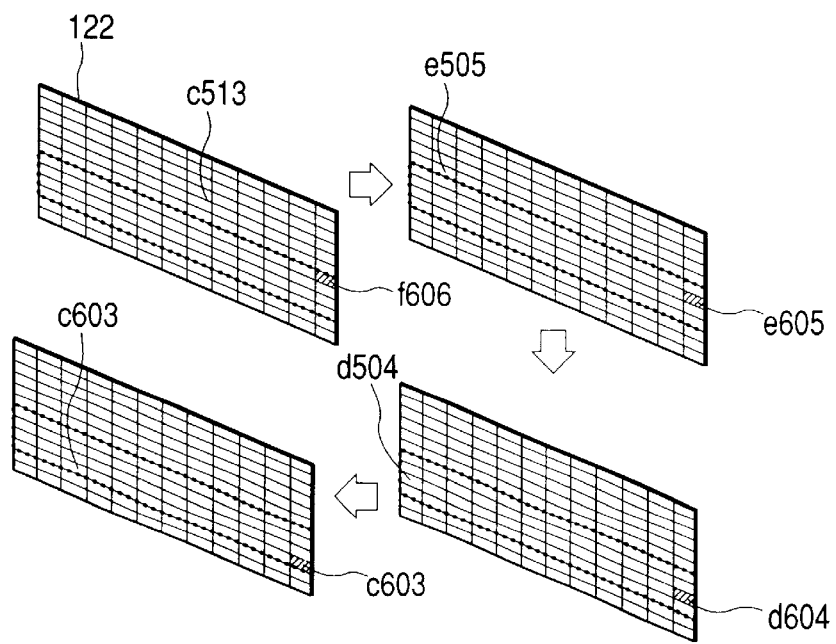
FIG. 8(b) is a perspective which shows sequential switching of light-sensitive pixels of a light-sensitive sensor when it is required to shift a scanned portion of a radar range upward in the first modification as shown in FIGS. 6(a) and 6(b)

FIGS. 7(a) and 7(b) show an operation of the radar system using the light-sensitive sensor 122 of FIGS. 6(a) and 6(b) to emit laser beams through the central laser-emitting window E205. FIGS. 8(a) and 8(b) show an operation of the radar system to emit laser beams through the laser-emitting window C203 provided higher than the central laser-emitting window E205. At a time when the laser beam is, as shown in FIG. 7(a), radiated to the leftmost portion of the lateral radar field of view e215 during each lateral scan, a return of the laser beam falls on the rightmost vertical array of the cells within the laser-sensitive area e515 of the light-sensitive sensor 122. Therefore, when the laser beam is radiated to the leftmost portion of the later radar field of view e215 during the first lateral scan, the laser radar CPU 70 activates, as clearly shown in FIG. 7(b), the uppermost one of central four of the rightmost vertical array of the cells, that is, the light-sensitive pixel h608 through the vertical and horizontal selectors 151 and 152. In following lateral scans, the laser radar CPU 70 activates the light-sensitive pixels g607, f606, and e605 sequentially when the laser beam is radiated to the leftmost portion of the laser radar field of view e215. The switching of the laser-emitting windows A201 to I209 is the same as that described in FIG. 4, and explanation thereof in detail will be omitted here. U.S. Pat. No. 6,301,003 B1, issued on Oct. 9, 2001, assigned to the same assignee as that of this application, teaches a scan operation which may be employed in this modification, disclosure of which is incorporated herein by reference.

Figure 9:
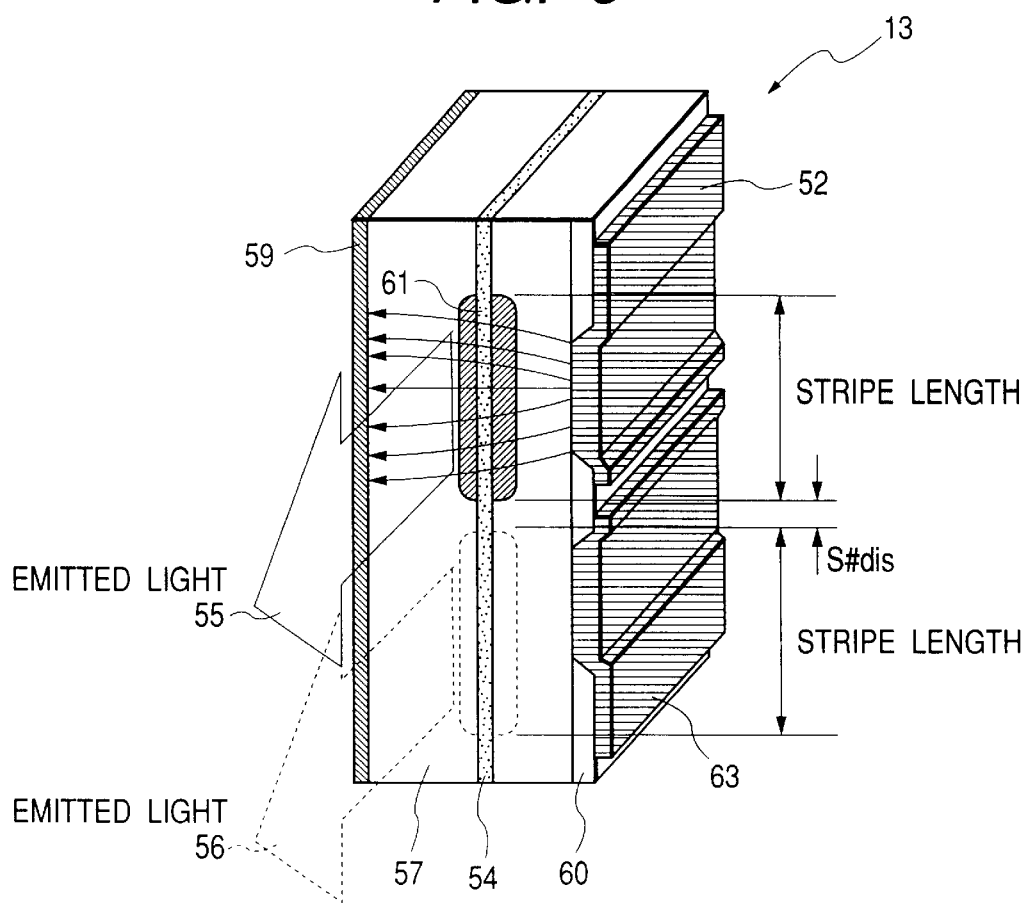
FIG. 9 shows a modification of a light-sensitive sensor implemented by a multi-stripe semiconductor laser.

FIG. 9 shows a second modification of the radar system.

While the radar system, as shown in FIGS. 1(a) and 1(b), is designed to shape a laser beam emitted from the laser diode 13 through the diaphragm to have a rectangular cross section and further shape it through the light-emitting lens 14 into a long and narrow cross section in the vertical direction which covers a vertical angle of 2° within the total laser-emitting range 200, a multi-stripe semiconductor laser 13, as illustrated in FIG. 9, may be used instead which has a plurality of discrete laser emitting areas.

The multi-stripe semiconductor laser 13, as shown in FIG. 9, is made up of a lower electrode 59, two upper electrodes 52 and 63, a substrate 57, a light emissive layer 54, and an insulating layer 60 interposed between the lower electrode 59 and the upper electrodes 52 and 63. Application of voltage only to the upper electrode 52 will cause light 59 having a given stripe length to be emitted from one of the laser-emitting areas 61 of the light emissive layer 54 stimulated by the application of voltage. Similarly, application of voltage only to the upper electrode 63 will cause light 56 to be emitted from one of the laser-emitting areas of the light emissive layer 54 stimulated by the application of voltage. Formed between adjacent two of the laser-emitting areas 61 is a non-emissive gap S #dis from which no light is emitted.

Figure 10A:
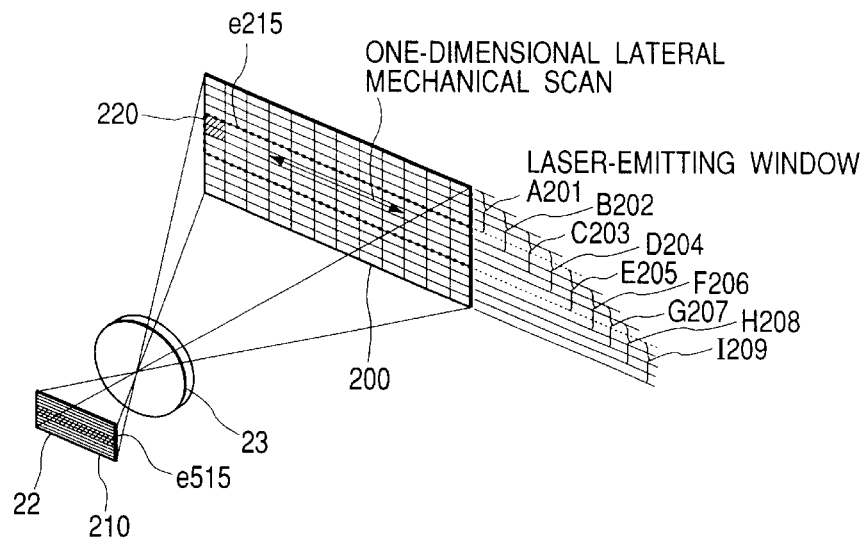
FIG. 10(a) is a perspective view for explaining selection of laser-emitting windows and light-sensitive pixels of a light-sensitive sensor when it is required to scan a central portion of a radar range in a case where the multi-stripe semiconductor laser as shown in FIG. 9(a) is used.
Figure 10B:
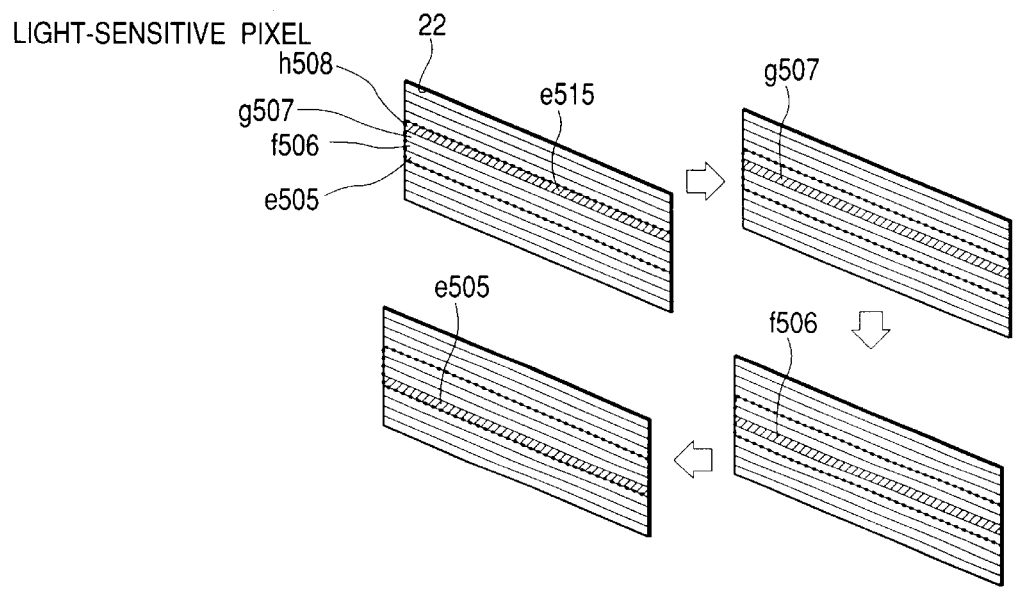
FIG. 10(b) is a perspective which shows sequential switching of light-sensitive pixels of a light-sensitive sensor when it is required to scan a central portion of a radar range in a case where the multi-stripe semiconductor laser as shown in FIG. 9(a) is used.
Figure 11A:
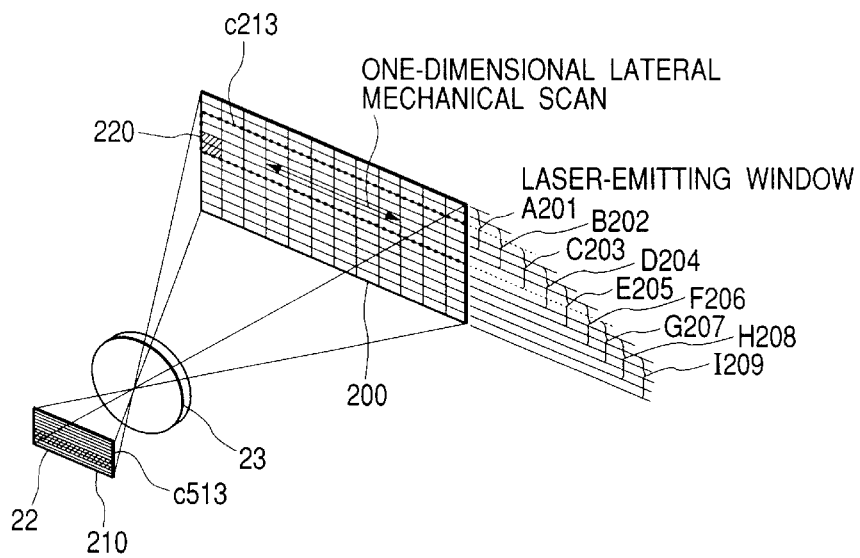
FIG. 11(a) is a perspective view for explaining selection of laser-emitting windows and light-sensitive pixels of a light-sensitive sensor when it is required to shift a scanned portion of a radar range upward in a case where the multi-stripe semiconductor laser as shown in FIG. 9(a) is used.
Figure 11B:
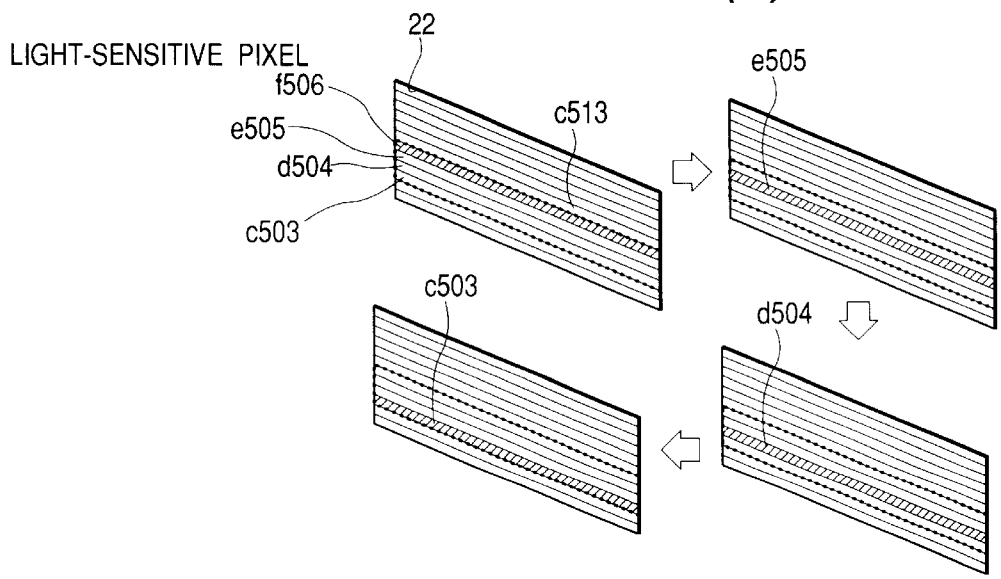
FIG. 11(b) is a perspective which shows sequential switching of light-sensitive pixels of a light-sensitive sensor when it is required to shift a scanned portion of a radar range upward in a case where the multi-stripe semiconductor laser as shown in FIG. 9(a) is used.

When it is required to emit a laser beam through the laser-emitting window E205, the laser radar CPU 70 first applies the voltage only to the upper electrode 63 to produce the laser beam 220, as shown in FIG. 10(a), and scans an upper half of the laser-emitting window E205 one-dimensionally in a single scan. Next, the laser radar CPU 70 applies the voltage to the upper electrode 52 to scan a lower half of the laser-emitting window E205 one-dimensionally in a single scan. The sequential switching of the light-sensitive pixels h508 to e505, as shown in FIGS. 10(b) and 11(b), are the same as that described above, and explanation thereof in detail will be omitted here.

The use of the multi-stripe semiconductor laser results in a decreased power used to produce a laser beam, which leads to improvement of durability of the semiconductor laser and a decrease in heat dissipation therefrom. Further, discrete energization of the laser-emitting areas 61 results in improved vertical radar resolution over a lateral angel of the total laser-emitting range 200. This is because a spot size of a radar return falling on a peripheral portion of the light-sensitive sensor 122 made of two-dimensionally arrayed cells in the structure, as shown in FIGS. 6(a) and 6(b), becomes greater than that falling on a central portion of the light-sensitive sensor 122, thus resulting in a difficulty in ensuring a desired spatial resolution in a direction perpendicular to the scanning direction of the laser beam over the whole of the total laser-emitting range 200, but however, the discrete energization of the laser-emitting areas 61 of the multi-stripe semiconductor laser enables a vertical scan of a laser beam, thereby permitting the laser beam to be radiated onto a decreased area of the total laser-emitting range 200.

The radar system has been described as being used in automotive vehicles, however, may be employed in various applications. The radar system may also be used only to identify the type of a tracked object without measuring the distance to the object.

The laser-emitting window shifting mirror 15 is made of a galvano mirror, but may be made of a polygon mirror which consists of a plurality of mirror plates inclined vertically at different angles so that a laser beam radiated from the mirror 15 may also scan the total laser-emitting range 200 vertically. In a case where the nine laser-emitting windows A201 to I209, as shown in FIG. 2(a), are provided, the polygon mirror is preferably made up of nine mirror plates inclined vertically at different angles.

An example of optical locations of the laser diode 13 and the light-emitting lens 14 and a geometrical structure of the light-emitting lens 14 will be described below in detail. The optical locations of the laser diode 13 and the light-emitting lens 14 are illustrated in FIG. 9(b).

The light-emitting lens 14, as shown in FIG. 9(b), has a flat surface facing the laser diode 13 and an aspheric surface opposite the flat surface. The distance x between any point on the aspheric surface and a plane tangent to the aspheric surface at the vertex of the aspheric surface is usually given by a relation below.

$$x = Ch^2/(1+(1-(1+k)C^2h^2)^{1/2})$$

where h is the height from an optical axis, R is the radius of curvature of the aspheric surface at the vertex, C is the curvature of the aspheric surface at the vertex (1/R), and k is the constant of the cone.

Specifications of the light-emitting lens 14 and the laser diode 13 are listed, as an example, in a table below.

| N | R | k | F | D | $f_b$ | $f_{LD}$ | $\Delta f_{LD}$ | S # dis |
|---|---|---|---|---|---|---|---|---|
| 1.5174 | 7.459 | −0.547 | 14.416 | 3 | 12.416 | 12.3 | 0.116 | 4 | where N is the refractive index, f is the focal length of the lens 14, D is the thickness of the lens 14, $f_b$ is the back focus of the lens 14, $f_{LD}$ is the distance between the laser diode 13 and the flat surface of the lens 14, $\Delta f_{LD}$ is, as described later in detail, an amount by which the laser diode 13 is brought close to the lens 14 from the focal point, S#dis is the non-emissive gap of the laser diode 13, as shown in FIG. 9(a). Note that k and N are non-dimensional, and the unit of other parameters is mm.

In a case where the light-emitting lens 14 having the specifications, as listed in the above table and a single-stripe semiconductor laser are used, if the stripe length of the semiconductor laser is 500 μm, a laser beam has a vertical cross section ranging over approximately 2° in the total laser-emitting range 200. In a case where a two-stripe semiconductor laser is used, if the stripe length of the semiconductor laser is 248 μm, a laser beam has a vertical cross section ranging over approximately 1° in the total laser-emitting range 200.

The multi-stripe semiconductor laser is permitted to activate discrete laser emitting areas thereof independently, thereby resulting in a decrease in emission power consumed in the laser, which leads to an increased service life of the laser.

However, the multi-strip semiconductor laser usually has a non-emissive area between adjacent two of the laser emitting areas, thus resulting in a greatly reduced intensity of light emitted in a direction corresponding to each non-emissive area, which makes it impossible to measure the distance to a target in that direction. This will be described in detail below with reference to FIG. 13.

Figure 13:
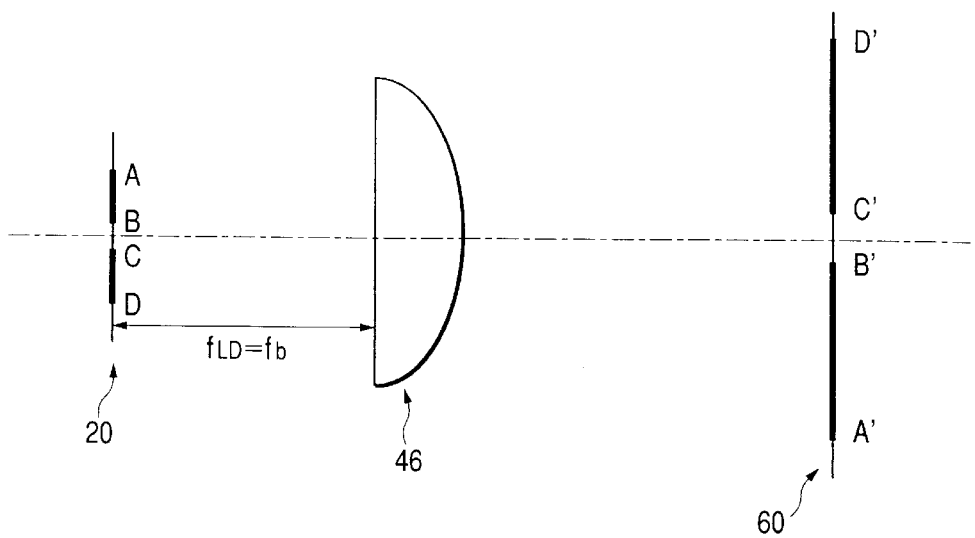
FIG. 13 is a schematic view which shows a positional relation between a laser and a lens which causes an area in which it is impossible to measure the distance to a target to be formed on a screen.

FIG. 13 is a schematic side view which shows the semiconductor laser 20, the lens 46, and the screen 60. The semiconductor laser 20 is a two-stripe semiconductor laser which has two laser emitting areas A-B and C-D. If the laser 20 is, as shown in the drawing, located a distance $f_{LD}$ (=back focus $f_b$ of the lens 46) behind the lens 46, laser beams produced from the laser emitting areas A-B and C-D are radiated to areas A'-B' and C'-D' of the screen 60, respectively. A non-emissive area B-C of the laser 20 is, therefore, projected to an area B'-C' of the screen 60. Specifically, it is impossible to measure the distance to a target existing near an optical axis.

The above problem may be avoided by adjusting the distance between the laser 20 and the lens 46 as discussed below.

Figure 15:
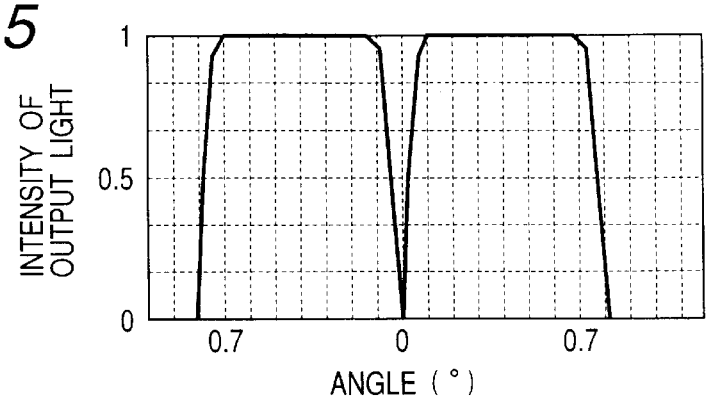
FIG. 15 is a view which shows a light intensity distribution on the screen in an example of FIG. 13.
Figure 16A:
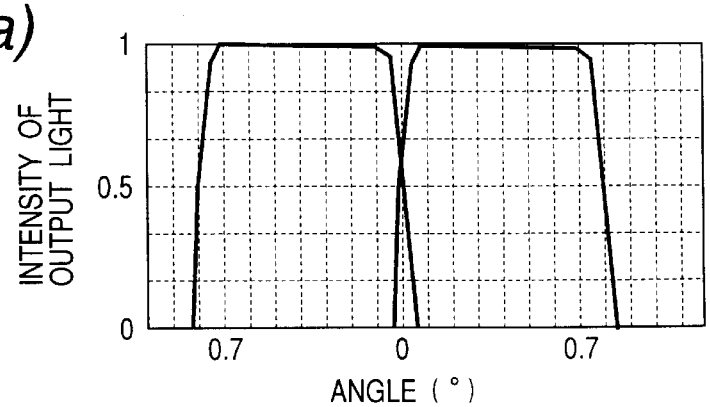
FIGS. 16(a) and 16(b) are views which show a light intensity distribution on the screen in an example of FIG. 14.
Figure 16B:
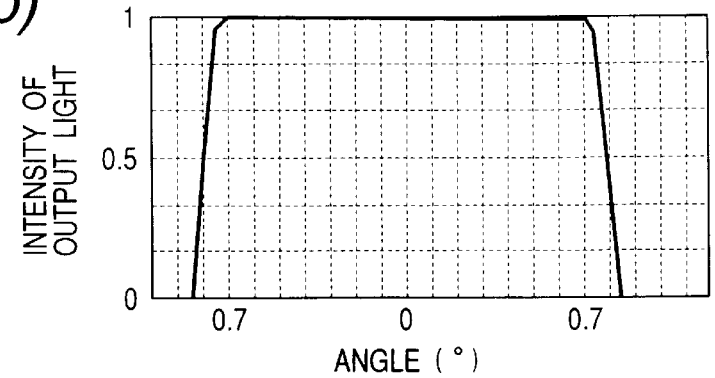

FIGS. 15, 16(a), and 16(b) each show a light intensity distribution. The ordinate axis indicates the intensity of light on the screen 60 as a function of the distance between the laser 20 and the screen 60. The abscissa axis indicates an angular direction of emission of a laser beam.

Figure 14:
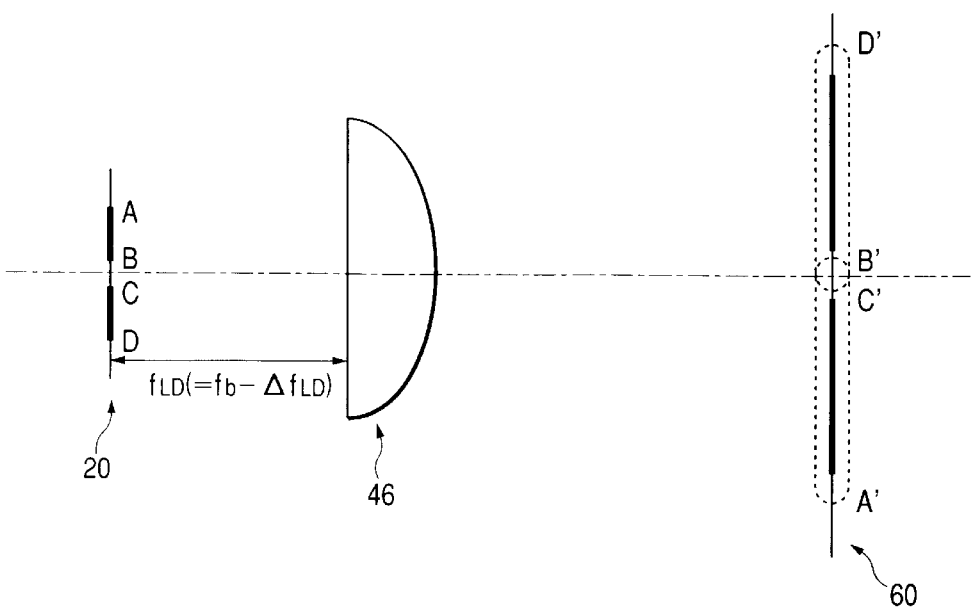
FIG. 14 is a schematic view which shows a positional relation between a laser and a lens which eliminates an area on a screen within which it is impossible to measure the distance to a target.

If $f_{LD}=f_b$, as shown in FIG. 13, the laser beams emitted from the two laser-emitting areas A-B and C-D do not overlap each other around the optical axis (i.e., in the angular direction of 0°), so that the intensity of light around the optical axis is, as shown in FIG. 15, lowered greatly. If the laser 20 is, a shown in FIG. 14, brought close to the lens 46 and placed at a distance $f_{LD}(=f_b-\Delta f_{LD})$ from the lens 46, the laser beams emitted from the laser-emitting areas A-B and C-D overlap each other, as shown in FIG. 16(a), around the optical axis, so that the intensity of light on the screen 60, as shown in FIG. 16(b), will be uniform as a whole.

Figure 17:
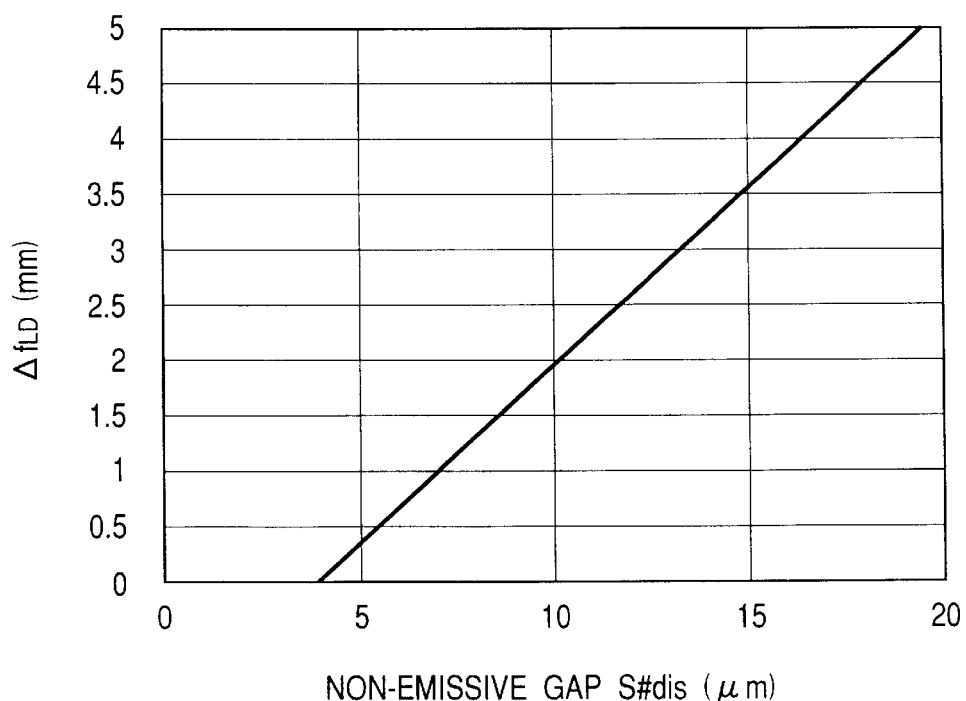
FIG. 17 is a graph which shows a relation between a non-emissive gap of a multi-stripe semiconductor laser and a distance by which the laser is to be brought close to the lens from a location, as shown in FIG. 13, to a location, as shown in FIG. 14.

The distance $\Delta f_{LD}$ by which the laser 20 is brought close to the lens 46 is a distance required to defocus the laser beams at a desired location (i.e., on the screen 60) to overlap the laser beams emitted from the laser-emitting areas A-B and C-D around the optical axis and may be determined in a relation, as shown in FIG. 17, to the non-emissive gap S#dis, as shown in FIG. 9.

The radar system is, as describe above, designed to selectively activate the light-sensitive cells of each of the light-sensitive sensors 22 and 122, which are laid adjacent each other in the vertical direction, every one-dimensional lateral scan of the laser beam for acquiring locational information about the target in the vertical direction, but instead, a laser emitter may be employed which is made up of a matrix of laser-emitting elements capable of being activated selectively in the vertical direction as well as the lateral direction.

While the present invention has been disclosed in terms of the preferred embodiments in order to facilitate better understanding thereof, it should be appreciated that the invention can be embodied in various ways without departing from the principle of the invention. Therefore, the invention should be understood to include all possible embodiments and modifications to the shown embodiments which can be embodied without departing from the principle of the invention as set forth in the appended claims.

What is claimed is:

1. An object detecting apparatus comprising:

a laser emitter emitting a laser beam;

a laser scanner designed to swing the laser beam emitted from said laser emitter in a first direction in a cycle within a given object detection zone, said laser scanner being also designed to move in a second direction substantially perpendicular to the first direction, the laser beam having a cross section which is elongated in the second direction so as to scan an area selected within the object detection zone in one scan cycle;

a light-sensitive sensor, when activated, sensitive to a return of the laser beam from a reflective object present in the object detection zone to produce a signal for acquiring given information on the object, said light-sensitive sensor including a plurality of light-sensitive cells arrayed adjacent to each other in the second direction;

a selecting circuit working to select ones of the light-sensitive cells to be activated in sequence one in each scan cycle of the laser beam; and an area shifting circuit working to determine a position of the object in the second direction within said selected area using the signal outputted from said light-sensitive sensor and move said laser scanner to shift said selected area in the second direction within the object detection zone based on the position of the object.

2. An object detecting apparatus as set forth in claim 1, wherein said laser emitter includes a multi-stripe semiconductor laser which has a plurality of discrete light-emissive areas formed in a single emission layer, the light-emissive areas being activatable to emit laser beams, respectively, which has a total sectional area elongated in the second direction so as to scan said area selected within the object detection zone in each scan cycle.

3. An object detecting apparatus as set forth in claim 1, further comprising a distance determining circuit working to measure a time the laser beam takes to travel to and return from the object to determine a distance to the object.

4. An object detecting apparatus as set forth in claim 1, wherein said selecting circuit switches between the light-sensitive cells every scan cycle of the laser beam.

5. An object detecting apparatus as set forth in claim 1, wherein said selecting circuit works to select a given number of the light-sensitive cells corresponding to said area selected within the object detection zone to be activated, one for each scan cycle of the laser beam.

6. An object detecting apparatus as set forth in claim 1, wherein said area shifting circuit works to move said laser scanner to shift said selected area in the second direction within the object detection zone so as to acquire the object at a fixed position within said selected area at all times.

7. An object detecting apparatus comprising:
a laser emitter emitting a laser beam;
a laser scanner designed to swing the laser beam emitted from said laser emitter in a first direction in a cycle within a given object detection zone, said laser scanner being also designed to move in a second direction substantially perpendicular to the first direction, the laser beam having a cross section which is elongated in the second direction so as to scan an area selected within the object detection zone in a single scan cycle;
a light-sensitive sensor, when activated, sensitive to a return of the laser beam from a reflective object present in the object detection zone to produce a signal for acquiring given information on the object, said light-sensitive sensor including a plurality of first arrays of light-sensitive cells aligned in the first direction and a plurality of second arrays of light-sensitive cells aligned in the second direction;
a selecting circuit working to selecting a given number of the light-sensitive cells to be activated in each scan cycle of the laser beam; and
an area shifting circuit working to determine a position of the object in the second direction within said selected area using the signal outputted from said light-sensitive sensor and move said laser scanner to shift said selected area in the second direction within the object detection zone based on the position of the object.

8. An object detecting apparatus as set forth in claim 7, further comprising a distance determining circuit working to measure a time the laser beam takes to travel to and return from the object to determine a distance to the object.

9. An object detecting apparatus as set forth in claim 7, wherein said area shifting circuit works to move said laser scanner to shift said selected area in the second direction within the object detection zone so as to acquire the object at a fixed position within said selected area at all times.

10. An object detecting apparatus comprising:
a laser scanner designed to swing a laser beam in a first direction in a cycle within a given object detection zone, said laser scanner being also designed to move in a second direction substantially perpendicular to the first direction;
a laser emitter including laser emitting elements arrayed in the second direction, each of the laser emitting elements working to output a laser beam to said laser scanner;
a light-sensitive sensor sensitive to a return of the laser beam from a reflective object present in the object detection zone to produce a signal for acquiring given information on the object;
a selecting circuit working to switch between the laser emitting elements of said laser emitter in the second direction in each scan cycle of the laser beam; and
an area shifting circuit working to determine a position of the object in the second direction within said selected area using the signal outputted from said light-sensitive sensor and move said laser scanner to shift said selected area in the second direction within the object detection zone based on the position of the object.

11. An object detecting apparatus as set forth in claim 10, further comprising a distance determining circuit working to measure a time the laser beam takes to travel to and return from the object to determine a distance to the object.

12. An object detecting apparatus as set forth in claim 10, wherein said laser emitter includes a multi-stripe semiconductor laser.

* * * * *